United States Patent [19]

Hennig

[11] Patent Number: 5,541,511
[45] Date of Patent: Jul. 30, 1996

[54] METHOD OF MAGNETIC RESONANCE IMAGING FOR THE PRODUCTION OF RARE IMAGES WITH ADDITIONAL PREPARATION OF THE MAGNETIZATION FOR CONTRAST VARIATION

[76] Inventor: Jürgen Hennig, Johann-von-Weerth-Strasse 12, 79100 Freiburg im Breisgau, Germany

[21] Appl. No.: 289,058

[22] Filed: Aug. 11, 1994

[30] Foreign Application Priority Data

Aug. 11, 1993 [DE] Germany .................. 43 26 902.8

[51] Int. Cl.⁶ .................................................. G01R 33/48
[52] U.S. Cl. ........................ 324/309; 324/314; 128/653.2
[58] Field of Search .................................... 324/318, 322, 324/307, 309, 315, 314, 312, 306; 128/653.2, 653.3

[56] References Cited

U.S. PATENT DOCUMENTS

| | | | |
|---|---|---|---|
| 4,818,940 | 4/1989 | Hennig et al. | 324/309 |
| 5,027,072 | 1/1991 | Rinaldi | 324/312 |
| 5,270,654 | 12/1993 | Feinberg et al. | 324/307 |
| 5,327,088 | 7/1994 | Pipe | 324/307 |
| 5,345,176 | 9/1994 | LeRoux et al. | 324/309 |
| 5,349,292 | 9/1994 | Sugiura | 324/309 |
| 5,378,987 | 1/1995 | Ishihara et al. | 324/315 |
| 5,412,321 | 5/1995 | Kohno et al. | 324/309 |

FOREIGN PATENT DOCUMENTS

| | | | |
|---|---|---|---|
| 0175184 | 3/1986 | European Pat. Off. | G01N 24/08 |
| 0302739 | 2/1989 | European Pat. Off. | G01N 24/08 |
| 3434161 | 7/1988 | Germany . | |

OTHER PUBLICATIONS

Magnetic Resonance in Medicine Vl. 27, No. 1, Sep. 01, 1992, DULUTH, MN, US p. 142–164, D. G. Norris et al. 'On the Application of Ultra–Fast Rare . . .'.

Magnetic Resonance in Medicine Vl. 27, No. 1, Sep. 01, 1992 DULUTH, MN, US p. 107–117, N. Higuchi et al. 'A Novel for Fat Supression in Rare . . .'.

Magnetic Resonance in Medicine Vl. 26, No. 2, Aug. 1, 1992, DULUTH, MN, US p. 328–341, P. S. Melki et al. 'Partial RF Echo Planar Imaging with . . .'.

OSHIO, Koichi, and Jolesz, Ferenc A.: Fast MRI by Creating Multiple Spin Echoes in a CPMG Sequence. In: Magnetic Resonance in Medicine, vol. 30, 1993, pp. 251–254.

Higuchi, N., Hiramatsu, K., Mulkern; R. V.: A Novel Method for Fat Supression in RARE Sequences. In: Magneitc Resonance in Medicine, Vo. 27, 1992, pp. 107–117.

Le Roux, Patrick, and Hinks. R. Scott: Stabilization of Echo Amplitudes in FSE Sequences. In: Magnetic Resonance in Medicine, vol. 30, 1993, pp. 183–190.

*Primary Examiner*—Sandra L. O'Shea
*Assistant Examiner*—Raymond Y. Mah

[57] ABSTRACT

An improved rapid acquisition relaxation enhanced (RARE) imaging method for measuring nuclear magnetic resonance in selected regions of a body is disclosed. The improved RARE imaging method includes introducing an evolution phase of time duration $t_2$ between the excitation pulse and the first refocusing pulse of the multi-echo train. The evolution phase is introduced to influence the magnetization of the observed nuclei in such a fashion that the intensity and/or phase of the subsequent signals are influenced as a function of this evolution phase. This allows the effects of flow, motion, diffusion and local magnetic field inhomogenities to be measured.

12 Claims, 8 Drawing Sheets

METHOD OF MAGNETIC RESONANCE IMAGING FOR THE PRODUCTION OF RARE IMAGES WITH ADDITIONAL PREPARATION OF THE MAGNETIZATION FOR CONTRAST VARIATION

BACKGROUND OF THE INVENTION

The invention concerns a method for the measurement of nuclear magnetic resonance in selected regions of a body for the purpose of imaging body cross sections with which the body is exposed to both a homogeneous magnetic field as well as to a selection gradient and is excited with a selective excitation impulse and, subsequently, the selection gradient is replaced by time-limited phase encoding and read gradients which are perpendicular to the selection gradient and to each other and the body is irradiated with a sequence of refocussing pulses through which a plurality of nuclear magnetic resonance signals are excited in the form of so-called spin echoes, whereby the switching-in time and strength of the gradients is adjusted to the pulse sequence in such a fashion that, at the time of occurrence of each refocussing pulse relative to the effect of the gradient, the nuclear spins have the same phase state as that at the point of time of the preceding refocussing pulse, whereby the read gradient is switched-in during the occurrence of the spin echo to be symmetric to same and the phase encoding gradients are switched-in following each refocussing pulse and are terminated before the appearance of the spin echo, switched-in again, with opposite directional influence, after the appearance of the spin echo and terminated once more before the next refocussing pulse, whereby the strength and/or duration of the phase encoding gradient is changed after every refocussing pulse and the spin echoes are computed into imaging signals taking into consideration the change in the phase encoding gradient in accordance with the two-dimensional Fourier transformation method.

This so-called RARE method is known in the art from U.S. Pat. No. 4,818,940.

The RARE method is a rapid imaging method with which spin echoes are produced following one excitation pulse through a plurality of refocussing pulses which are differently phase encoded through the application of suitable magnetic field gradients. In this fashion the number of differing phase encoding steps is significantly greater than the number of excitation pulses. In extreme cases all phase encoding steps which are necessary for image reconstruction can be obtained following one single excitation through production of correspondingly long echo trains. Due to the behaviour of transverse magnetization under the influence of such a sequence of equally spaced refocussing pulses, the sequence is extremely stable with regard to flow, motion, diffusion and magnetic field inhomogeneties which can occur in biological tissue due to, for example, changes in susceptibility.

A number of magnetic resonance imaging applications are precisely intended to measure or image these above mentioned effects. The purpose of the present invention is therefore to modify the known RARE method sequence in such a fashion that RARE is sensitive to such effects while maintaining the otherwise advantageous properties of rapid imaging and high stability of the Carr-Purcell-Meiboom-Gill-echo train.

SUMMARY OF THE INVENTION

This purpose is achieved in the accordance with the invention in that an evolution phase of time duration $t_e$ is introduced between the excitation pulse and the first refocussing pulse of the multi-echo train in such a fashion that the time difference between the excitation pulse and the first refocussing pulse is larger or smaller than the time duration $\tau$ between the first refocussing pulse of the multi-echo train and the first spin echo.

The introduction of the evolution phase of the method in accordance with the invention influences the magnetization of the observed nuclei in such a fashion that the intensity and/or phase of the subsequent signals are influenced as a function of this evolution phase. In this manner it is also possible to measure the above mentioned effects of flow, motion, diffusion and local magnetic field inhomogeneties using the modified RARE sequence based on the influence of the signals due to the evolution phase.

An embodiment of the method in accordance with the invention is preferred with which the time duration $t_e$ differs by 1 msec to 100 msec, preferentially by 10 msec, from the time duration $\tau$. The $T_2$ relaxation time can be taken to be the upper limit for $t_e$ which can not be substantially exceeded whereas the lower limit for $t_e$ is an evolution phase time duration with which the effects to be observed are just barely noticeable in the signal.

In most applications of the modified RARE method in accordance with the invention, the time duration $\tau$ assumes a value between 5 msec and 20 msec. The time duration of the entire pulse sequence is usually smaller than 20 sec but is usually larger than 1 sec.

In a particularly preferred embodiment the time duration $t_e$ is chosen to be larger than the time duration $\tau$. The time duration $t_e$ of the evolution phase can, however, also be shorter than the time duration $\tau$ between the refocussing pulse and the spin echo of the multi-echo train. In any event, the time duration $\tau$ is determined by the refocussing conditions of the modified RARE sequence and, in accordance with the invention, must be different than the time duration of the evolution phase.

An embodiment of the method in accordance with the invention is preferred in which the refocussing pulse of the multi-echo train is chosen in such a fashion that it causes the magnetization flip angle $\beta$ to differ from 180° so that spin echoes are produced which occur at the same times but, however, have differing phases $-\alpha$ or $+\alpha$ depending on their differing refocussing path formations. The dephasing effect can be transferred into an amplitude modulation of the signals through destructive superposition of the signals.

In a preferred variation of this embodiment, additional magnetic gradient impulses are switched-in in the direction of the read, phase encoding, or slice selection gradients symmetrically with respect to every other refocussing pulse of the multi-echo train. In this fashion the sensitivity of the signals to motion in the plane of the additionally switched-in gradients is amplified.

An improvement of this variation is preferred in which the magnetic gradient pulses are chosen in such a fashion that the signal portion of the spin echo from one of the possible signal groups having the dephasing $-\alpha$ or $+\alpha$ is eradicated. In this manner only one of the two possible signal groups is observed.

In another improvement of the above mentioned variation of the method the magnetic field gradient pulses are chosen in such a fashion that the signal portions of the spin echoes from both possible signal groups with the dephasing $-\alpha$ or $+\alpha$ occur shifted in time. In this case the signal portions of both signal groups can each be separately reconstructed into images of opposite dephasing.

An embodiment of the method in accordance with the invention is particularly preferred in which neither radio frequency (HF) pulses are irradiated nor gradients applied or switched during the evolution phase. In this embodiment, the evolution phase occurs in an additional time interval between the excitation pulse and the first refocussing pulse, whereby due to the difference between evolution phase time duration $t_e$ and the time interval $\tau$ between the subsequent refocussing pulse and the first spin echo, this echo and all subsequent echoes experience a dephasing and/or amplitude modulation which depends on the differing time intervals and on all mechanisms causing a time dependent dephasing of the transverse magnetization. When changing the time duration $t_e$ of the evolution interval the gradient effects are refocussed during the echo formation, whereas the time independent static effects of field inhomogeneties are not. In this fashion the local field inhomogeneties can therefore be rendered visible.

An embodiment of the method in accordance of the invention is particularly preferred in which, during the evolution phase and following a time interval of duration $t_{e1}$ after the excitation pulse, an additional refocussing pulse is irradiated to produce an additional spin echo after an echo time $t_{e1}$, whereby the timing of the first refocussing pulse of the multi-echo train is so chosen that the time interval between the additional spin echo and the first refocussing pulse of the multi-echo train is equal to the time interval $\tau$ between the first refocussing pulse of the multi echo train and the first spin echo thereby produced and whereby $t_{e1} \gg \tau$. The multi-echo train following the additional spin echo thereby experiences an additional $T_2$ weighting as well as a signal damping due to diffusion in the strong local magnetic fields. In this fashion effects of local field inhomogeneties can be suppressed, whereas the sensitivity of the method in accordance with the invention to motion and diffusion effects remains.

In a preferred variation, additional magnetic gradient pulses are switched during the evolution phase symmetric to the additional refocussing pulse to cause a dephasing of spins which move in the direction of the additional gradients. In this fashion an additional diffusion dependent signal damping is caused when diffusion is present.

An embodiment of the method in accordance with the invention is particularly preferred in which a pair of additional excitation pulses, separated by time an interval of duration $t_m$, are irradiated during the evolution phase following a time interval of duration $t_{e2}$ after the excitation pulse to produce a stimulated echo after a time duration $t_2$ following the second pulse of the pair and with which the timing of the first refocussing pulse of the multi-echo train is chosen in such a fashion that the time interval between the stimulated echo and the first refocussing pulse of the multi-echo train is equal to the time interval $\tau$ between the first refocussing pulse of the multi-echo train and the first spin echo thereby produced. The stimulated echo experiences a $T_1$ variation during the $t_m$ interval corresponding to the evolution of the magnetization, whereby a signal damping due to the diffusion of the magnetization in local magnetic field gradients also occurs.

In a preferred variation of this embodiment, additional magnetic gradient pulses are switched symmetrically during the evolution phase before the first excitation pulse of the pair and after the second excitation pulse of the pair to cause a dephasing of spins, the spins moving in the direction of the additional gradients. This leads to an additional signal damping due to diffusion in consequence of the dephasing.

In order to observe the above mentioned effects of field inhomogeneties, motion sensitivity, flow and diffusion in an image recorded with the method of the invention, a preferred embodiment provides for the recording of a image slice of the object under observation in a second measuring step using the unmodified RARE method and forming a difference of signal amplitudes relative to the first measurement step. For images of largely homogeneous tissue, a simple comparison of the inhomogeneties visible in the method according to the invention can, however, provide an indication of the above mentioned effects without requiring a difference measurement.

The invention is described and explained in greater detail below with the embodiments in connection with the drawing. The features which can be extracted from the description and the drawing can be utilized in other embodiments of the invention individually or collectively in arbitrary combination.

DESCRIPTION OF THE PREFERRED EMBODIMENT

Figure 1:
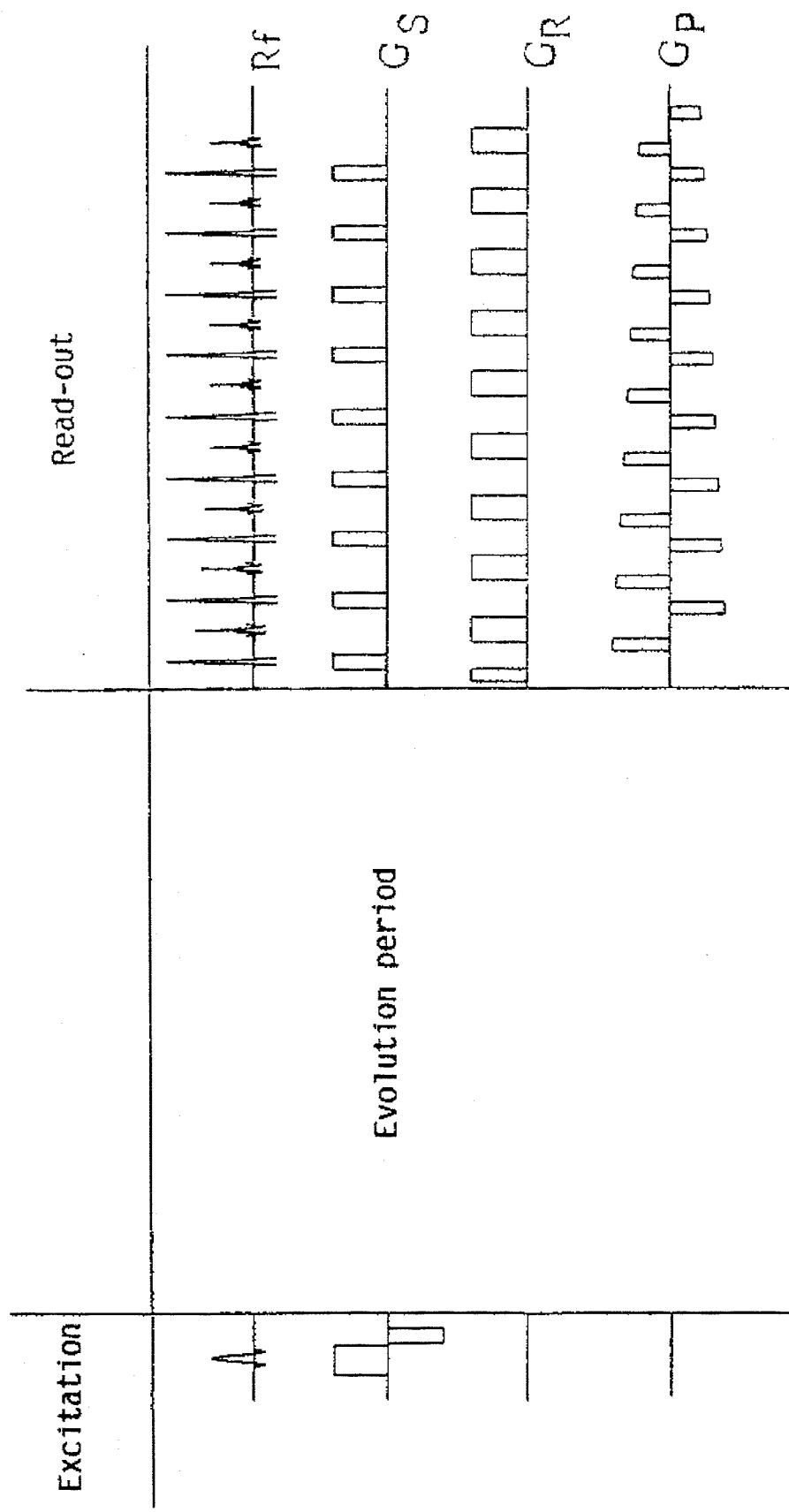
FIG. 1 shows an amplitude (vertical direction) versus time (horizontal direction) diagram of a pulse sequence of the method in accordance with the invention, whereby the high frequency pulse or echo signal is labeled with Rf, the slice selection gradient $G_S$, the read gradient $G_R$ and the phase encoding gradient $G_P$.

FIG. 1 shows the manner in which the method in accordance with the invention modifies the RARE sequence in such a fashion that an evolution phase is introduced between the excitation pulse (generally a 90° RF pulse) and the production of the CPMG echo train during which the spin system develops as a function of the parameters to be observed. The magnetization prepared in this fashion is subsequently read-out with a multi-echo train and phase encoded in the manner known through the RARE method so that the information required for image reconstruction can be collected after one or more of such excitation cycles.

In FIG. 1, and in the following figures, Rf indicates the sequence of high frequency pulses and signals, $G_S$ the slice selection gradient, $G_R$ the read gradient and $G_P$ the phase encoding gradient. A plurality of possible methods for configuring the evolution phase in order to achieve the desired sensitivity to different parameters, will be presented below.

In addition to the utilization of the actual RARE sequence it is also possible to read-out the data using a sequence with which a plurality of signals can be produced within each spin echo refocussing by means of gradient inversion (GRASE method).

1. Susceptibility sensitive RARE
1.1. Static susceptibility

In this case two different susceptibility effects can be separately observed. The static susceptibility is due to the time dependent dephasing of spins in differing local magnetic fields and the dynamic susceptibility effect is caused by diffusion of spins in strong local magnetic field gradients.

The first effect which is completely suppressed by refocussing in the normal RARE sequence, can be introduced into the RARE sequence by having the evolution phase transpire within a time interval during which the described effects develop. The magnetization prepared in this fashion is then read-out by multi-echo imaging.

Since the magnetic fields gradients are applied in accordance with the basic sequence, the high stability of the RARE sequence with regard to gradient independent dephasing is maintained. Thereby all signal portions contributing to a single echo always contribute coherently independent of the refocussing path. The signal coherence is therefore not destroyed by deviation of the refocussing flip angle from the ideal value of 180°.

Figure 2:
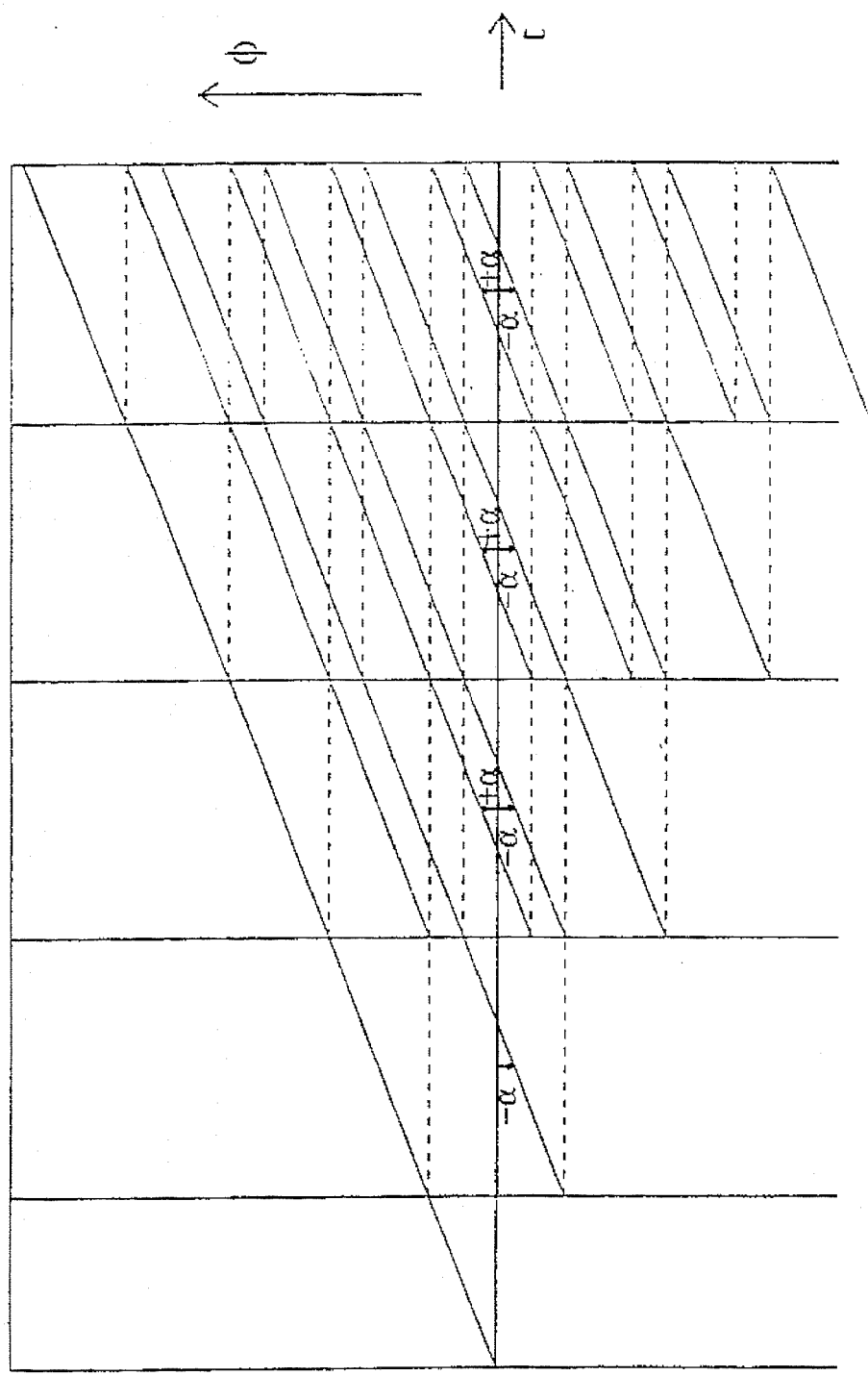
FIG. 2 shows a phase $\Phi$ diagram versus time (t) for the development of the phase $\Phi$ of a spin and the influence of the magnetic field inhomogeneties when utilizing the method in accordance with the invention.

As shown in the phase diagram of FIG. 2, this coherence is not present with regard to magnetic field inhomogeneties due to the additional preparation phase. FIG. 2 shows the time development of the phase $\Phi$ of a spin under the influence of the magnetic field inhomogeneties. The high frequency pulses are indicated as vertical lines. The diagonal lines correspond to the respective transverse magnetizations and the dashed horizontal lines to coherent z-magnetization which later leads to the formation of stimulated echoes. Signal formation always occurs in the middle between two refocussing pulses. In the standard RARE method this phase which is caused by inhomogeneties is equal to zero at the echo time. If one assumes a susceptibility dependent dephasing under change of the evolution period for the first echo formed by an amount $\alpha$ it can be shown that the subsequent signals are dephased by $+\alpha$ or $-\alpha$ depending on the refocussing path. The overlapping of the differing signal portions then leads to an incoherent overlapping and, in the extreme case, for $\alpha=90°$ and for equal distributions of magnetization in both signal groups, to the eradication of the signal.

Figure 3:
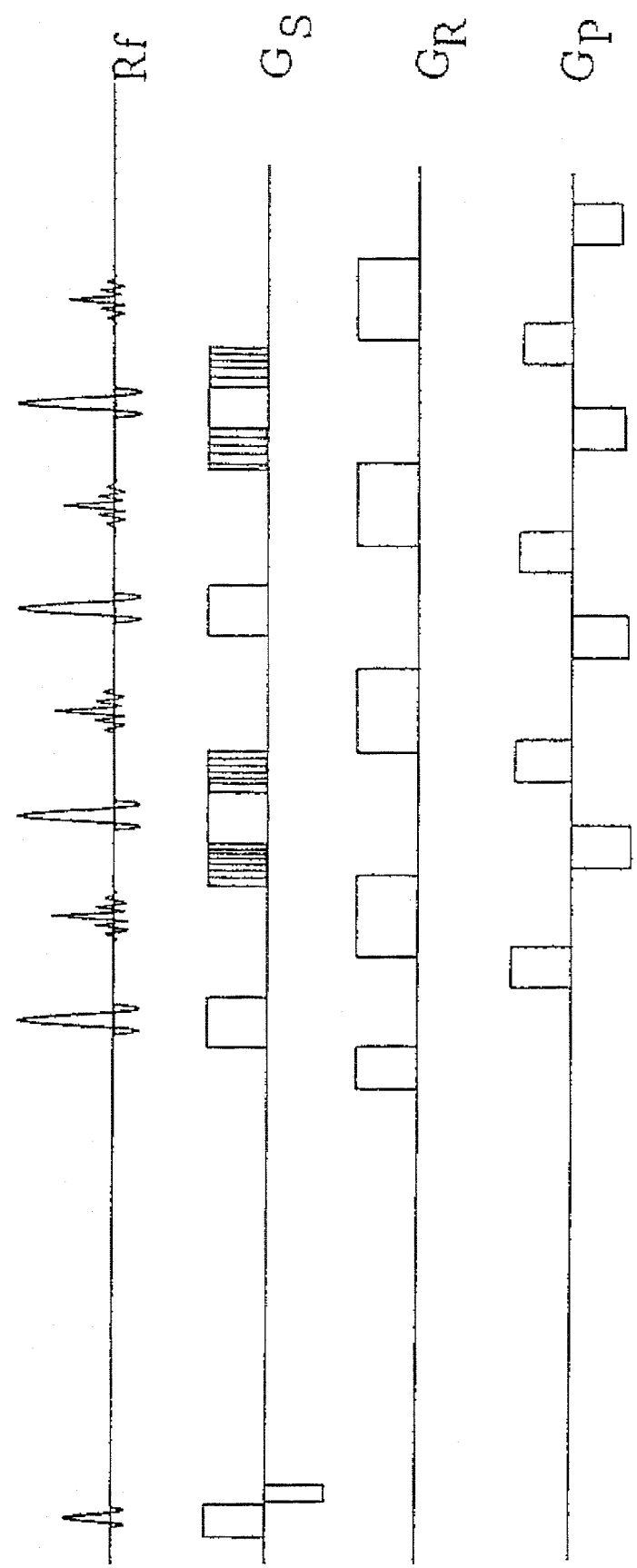
FIG. 3 shows an amplitude versus time diagram of a variation of the method in accordance with the invention with additional magnetic field gradient pulses symmetric to each second refocussing pulse, whereby one of the two possible signal groups is eradicated.

As shown in FIG. 3, it is possible to vary the method through the application of additional gradient pulses in such a fashion that both signal groups appear separately. In FIG. 3 both signal groups are separately produced between two refocussing pulses by introducing an additional gradient into the refocussing interval. This additional gradient is alternately switched from echo to echo before and after the signal which is to be read out since a signal with dephasing $+\alpha$ and in the next echo with dephasing $-\alpha$ would otherwise alternately occur in each case. This additional gradient is indicated in FIG. 3 as a shaded gradient in the direction of the slice selection gradient. In this case the signal portions which are not to be measured are dephased and therefore not observed.

Figure 4:
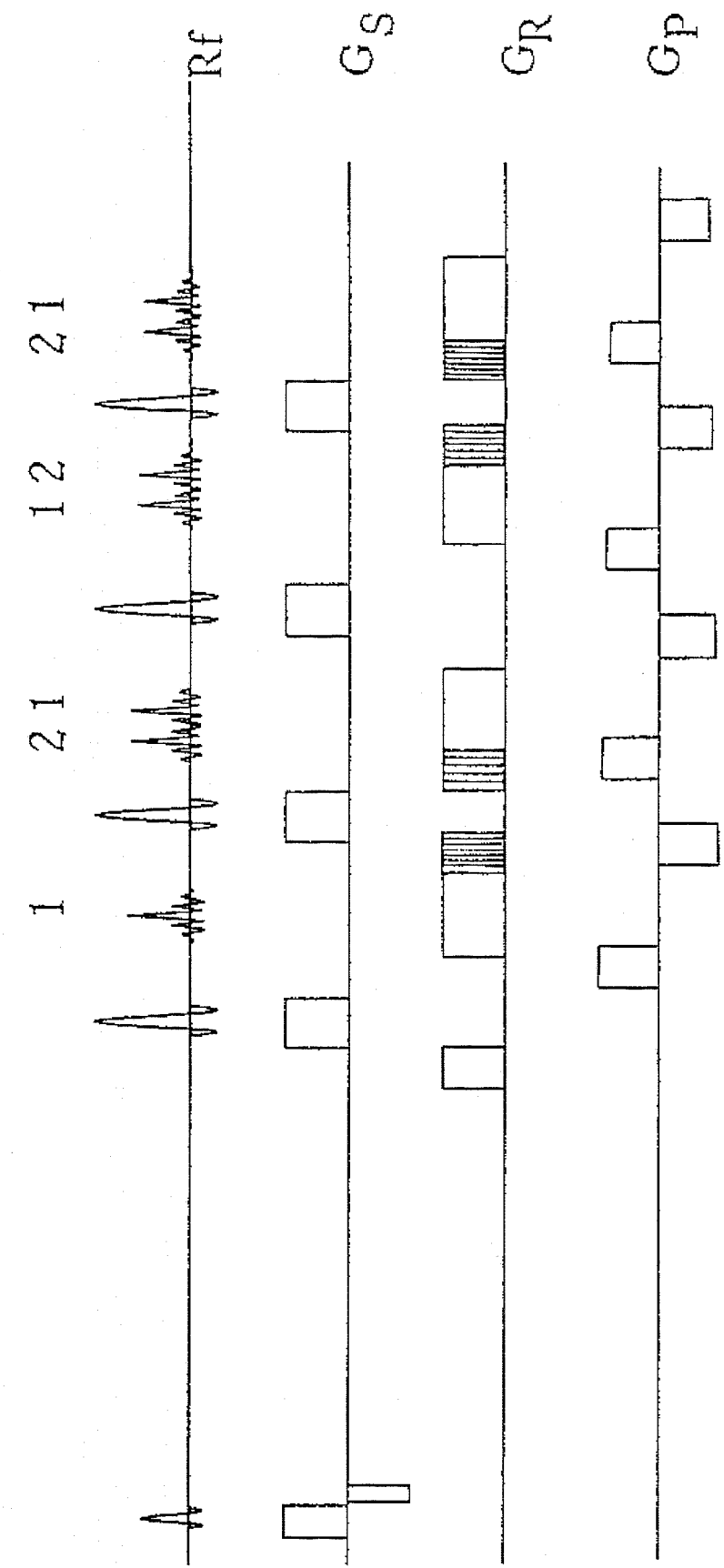
FIG. 4 shows an amplitude versus time diagram of a variation of the method in accordance with the invention with additional magnetic field impulses symmetric to each second refocussing pulse whereby the two signal groups are produced time-displaced from another.

As shown in FIG. 4, the additional gradient can also be applied in another direction, for example, in the direction of the read gradient. By utilizing this read gradient it is possible to observe both signal groups next to one another. It should be noted that the order of the sequence of correspondence of the echoes of both signal groups alternates from echo to echo, as indicated by the numbering of the echoes in FIG. 4.

Selection by means of additional gradients in the direction of the phase gradients is also possible. One should, however hereby observe that the additional gradient must exhibit an amplitude which is larger than the maximum size of the gradients used for spatial encoding since otherwise imaging artifacts could occur due to signal portions which are not completely dephased.

1.2 Dynamic susceptibility

The dynamic susceptibility effect occurs due to the diffusion of free by moving molecules in strong magnetic fields. A substantial difference compared to the static susceptibility effect is due to the fact that the coherence loss in transverse magnetization caused hereby can not be reversed by rephasing using spin echo formation. An experiment is consequently suitable for measuring this effect in which the corresponding evolution phase containing the effect exhibits a refocussing interval.

Figure 5:
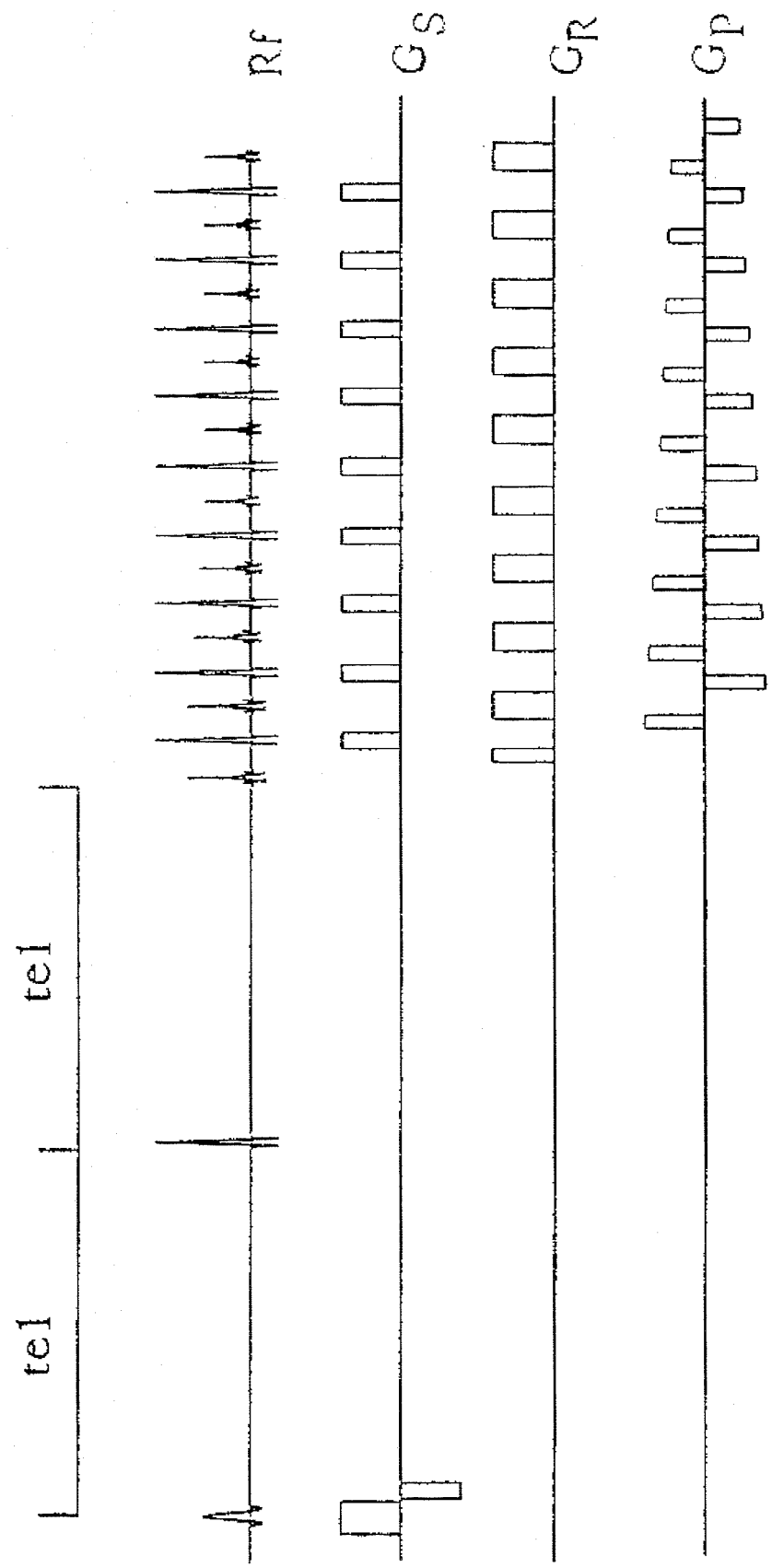
FIG. 5 shows an amplitude versus time diagram of a variation using an additional refocussing pulse in the evolution phase.

As shown in FIG. 5, the formation of a normal spin echo can be initially utilized for this purpose. The RARE sequence which results therefore comprises a first refocussing interval with a long echo time $2 \cdot t_{e1}$ in contrast to which, the signal production is effected by means of a rapid sequence of spin echoes with generally shorter echo time.

Figure 6:
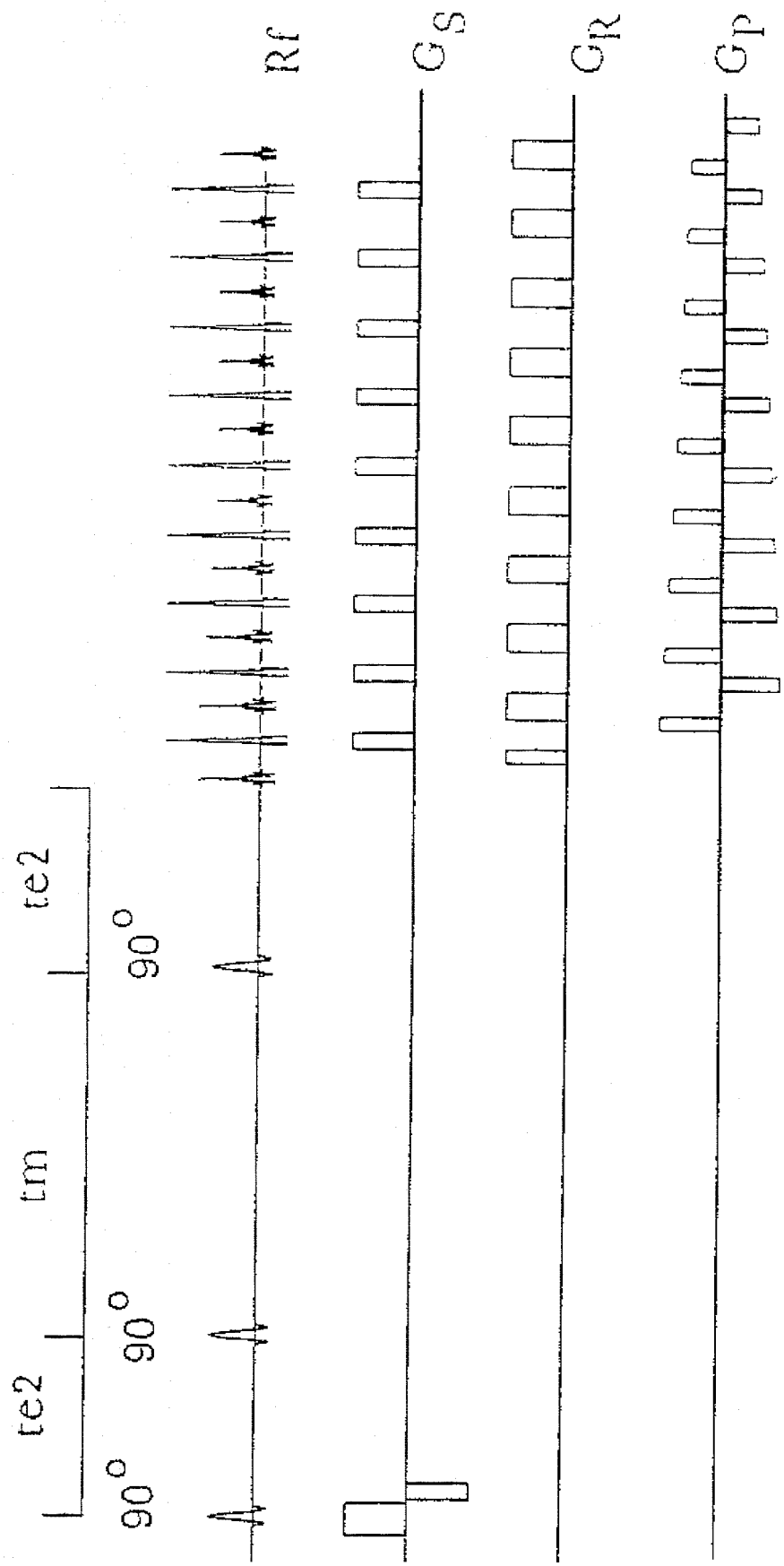
FIG. 6 shows an amplitude versus time diagram of a variation having a pair of additional 90° pulses in the evolution phase.

As shown in FIG. 6, the utilization of a stimulated echo through the introduction of two 90° pulses in the evolution time is likewise sensitive to dynamic susceptibility. This is particularly the case when very long preparation times are to be utilized for the measurement of small effects since the slower signal decay during the $t_m$ interval with the longitudinal relaxation time $T_1$ compensates by 50% for the inherent signal loss in comparison to the spin echo, since the latter decays in biological tissue with the often drastically shorter $T_2$ relaxation time.

2. Motion and diffusion measurements

Figure 7A:
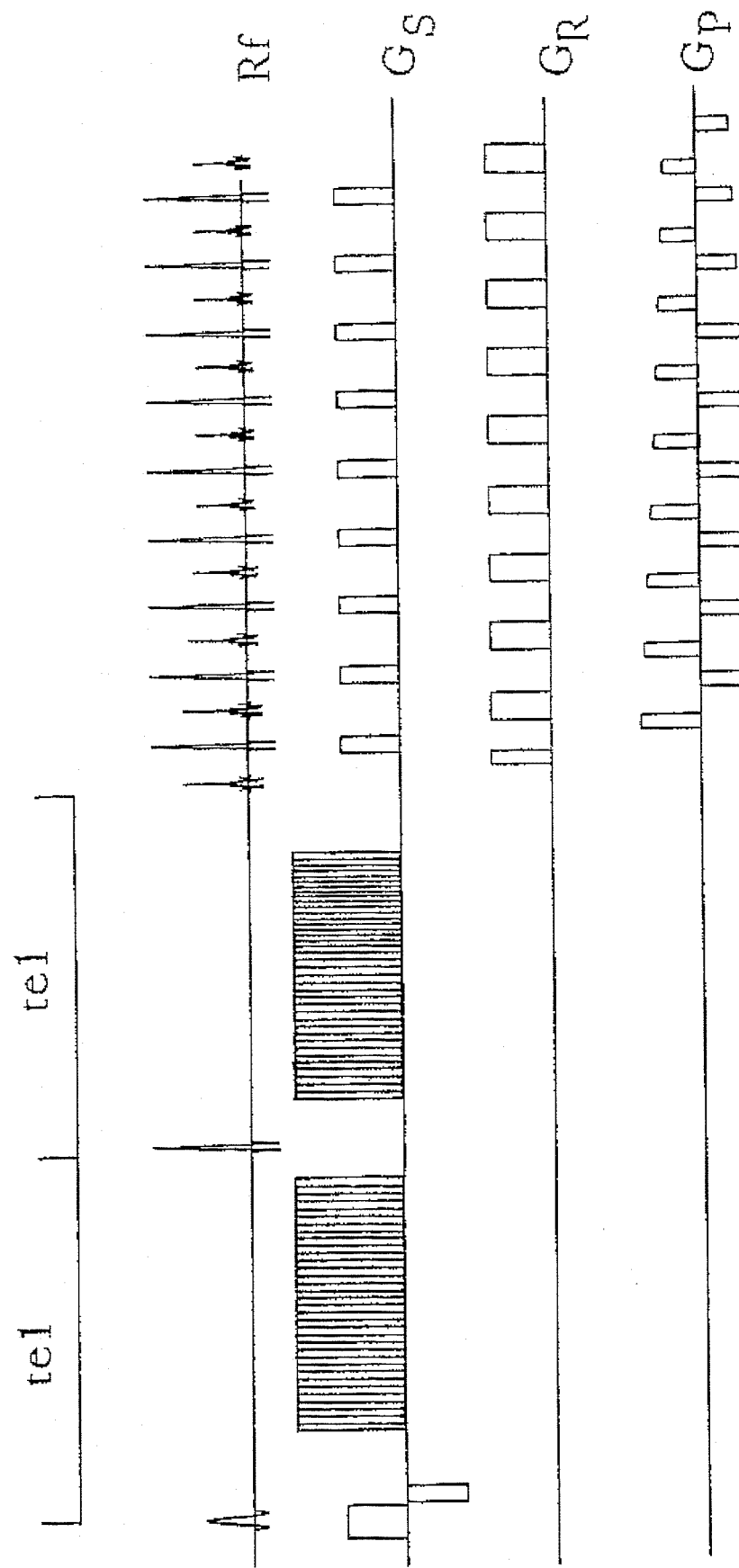
FIG. 7a shows an amplitude versus time diagram of a variation with an additional refocussing pulse in the evolution phase and with additional applied gradients during the evolution interval.
Figure 7B:
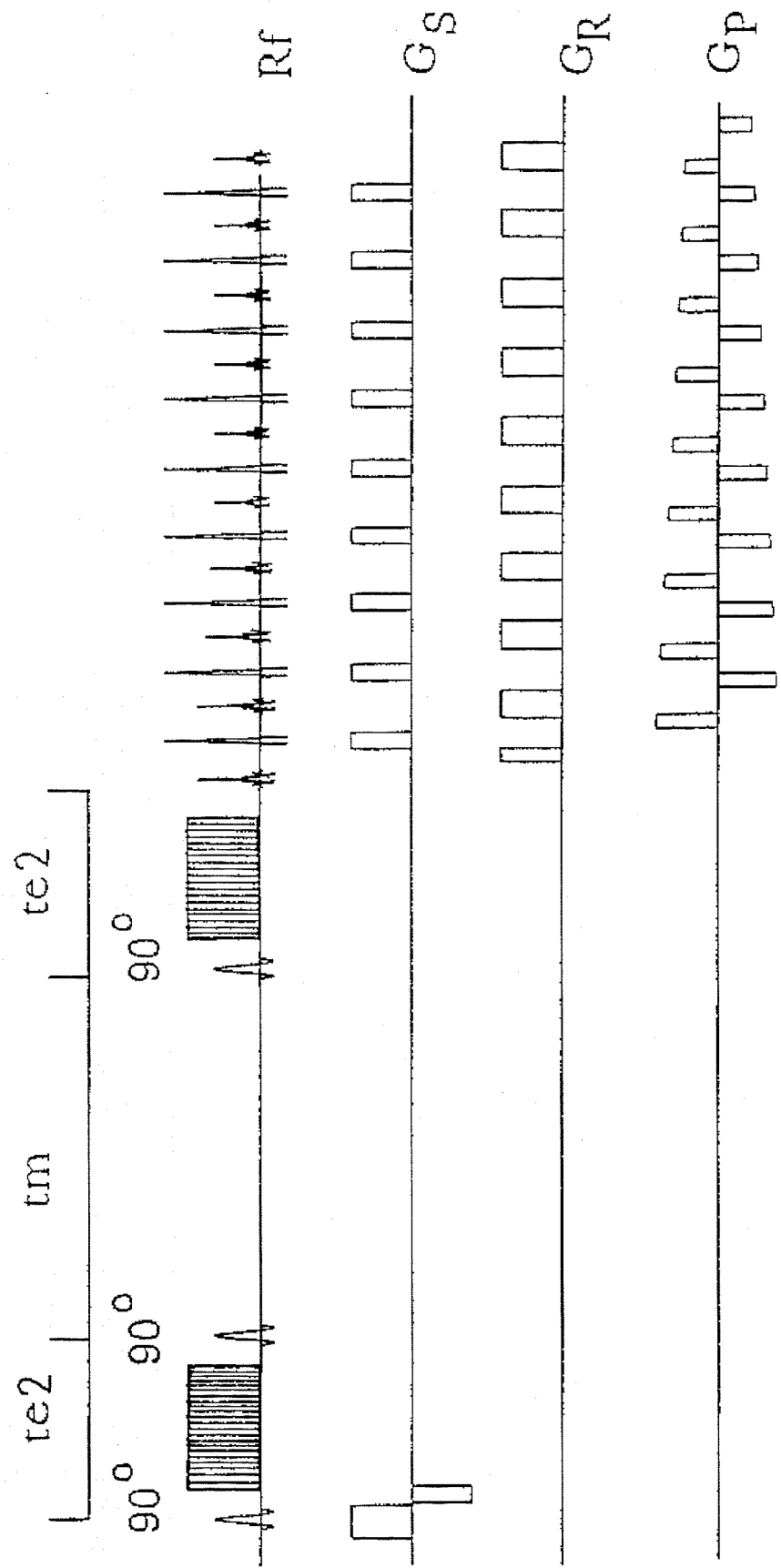
FIG. 7b shows an amplitude versus time diagram of a variation with a pair of additional 90° pulses during the evolution phase and with additionally applied gradients during the evolution interval.

As shown in FIGS. 7a and 7b, the macroscopic motion as well as the diffusion of spins which also occurs in homogeneous fields, can be measured with the methods described in section 1.2 if additional magnetic field gradients are introduced in the evolution phase. The corresponding sequences are shown in FIGS. 7a and 7b whereby, in comparison to the sequences described in the preceding section, added gradients are drawn as shaded.

The motion of the spins in the evolution phase leads to a phase change in the subsequently measured signals which can be determined either by direct measurement or through a reference experiment having differing motion encoding gradients, whereby such reference experiments are preferentially carried out either through the removal or inversion of the motion encoding gradient. In the case of microscopic diffusion, the stochastic dephasing of the spins within a voxel leads to a signal reduction.

Through variation of the strength of these gradients in sequential experiments it is possible to quantitatively precisely determine the diffusion constants.

In all methods described in sections 1.2 and 2 it is, for completeness, to be noted that the additional diffusion effects during the formation of the multi-echo train are small even though these, in their totality, last longer than the preparation interval since the diffusion effects with rapid refocussing in a multi-echo train are small.

One additionally notes that, in the sequences shown in FIGS. 5 to 7, additional signals can occur during the formation of the echoes due to the application of non-ideal pulses analogous to the splitting of the signal into two groups shown in FIG. 2. These can be suppressed, analogously to the manner of FIGS. 4 and 5, by additional gradients.

We claim:

1. A method for the measurement of nuclear magnetic resonance in selected regions of a body to image cross sections of the body comprising the steps of:

subjecting the body to a homogeneous magnetic field;

pulsing a slice selection gradient;

irradiating the body, in the presence of the slice selection gradient, with a first selective excitation pulse to excite nuclear spins in the body, the excited spins having phases;

subjecting the body to a sequence of pulsed, mutually perpendicular slice, read and phase encoding gradients having gradient strengths and occurring during gradient influence times and to a sequence of refocussing pulses, the refocussing pulses adapted to flip the nuclear spins by a magnetization flip angle $\beta \neq 180°$ to split each spin echo signal into a $-\alpha$ phase signal and a $+\alpha$ phase signal, the $-\alpha$ and the $+\alpha$ a signals occurring at the same times but having differing phases of $-\alpha$ and $+\alpha$ depending on formation mechanism refocussing paths, a first refocussing pulse occurring an evolution time $t_e$ after the first excitation pulse, the sequence of pulses and gradients generating a plurality of spin echo signals, a time separation $\tau$ between a refocussing pulse and its associated spin echo signal being such that $\tau \neq t_e$, the gradient strengths and gradient influence times being adjusted to cause the excited nuclear spin phases to be equal when each refocussing pulse is irradiated, wherein the read gradient influence time is symmetric to the spin echo signal and the phase encoding gradient influence time lies between the refocussing pulse and the spin echo signal, the phase encoding gradient having a direction of influence which is opposite for successive phase encoding gradient influence times and at least one of the phase encoding gradient strengths and the phase encoding gradient influence times is changed after each refocussing pulse, wherein at least one of an additional read, phase encoding, and slice selection gradient is pulsed symmetrically to every other refocussing pulse; and processing the spin echo signals into first imaging signals using two dimensional Fourier transformation under consideration of the changes in at least one of the phase encoding influence times and the phase encoding strengths.

2. The method of claim 1, wherein $1 \leq |t_e - \tau| \leq 100$ with $\tau$ and $t_e$ in units of msec.

3. The method of claim 2, wherein $|t_e - \tau| = 10$ msec.

4. The method of claim 1, wherein $t_e > \tau$.

5. The method of claim 1, wherein the at least one additional read, phase encoding, and slice selection gradient is adapted to eliminate one of the $-\alpha$ phase signal and the $+\alpha$ signal.

6. The method of claim 1, wherein the at least one additional read, phase encoding and slice selection gradient is adapted to produce the $+\alpha$ phase signal and the $-\alpha$ phase signal shifted in time with respect to each other.

7. The method of claim 1, wherein no excitation, gradient, and refocussing pulses are applied during the evolution time $t_e$.

8. The method of claim 1, further comprising irradiating, after a time interval of duration $t_{e1}$, with $\tau \ll t_{e1} < t_e$, following the first excitation pulse, an additional refocussing pulse during the evolution time to produce an additional spin echo at an additional spin echo time and choosing the first refocussing pulse of the refocussing pulse sequence to start at time $\tau$ after the additional spin echo time, wherein $2 t_{e1} + \tau = t_e$.

9. The method of claim 8, further comprising pulsing at least one of an additional read, phase encoding, and slice selection gradient during the evolution time symmetrically to the additional refocussing pulse to cause a dephasing of nuclear spins moving in a direction of the at least one additional read, phase encoding, and slice selection gradient.

10. The method of claim 1 further comprising irradiating a pair of additional excitation pulses, separated by a time interval of duration $t_m$, during the evolution time, the first pulse of the pair beginning at a time $t_{e2}$ following the first excitation pulse, to produce a stimulated echo at a stimulated echo time $t_{e2}$ following the second pulse of the pair and choosing a time interval between the stimulated echo time and irradiation of the first refocussing pulse of the refocussing pulse sequence to be equal to $\tau$, wherein $2 t_{e2} + t_m + \tau = t_e$.

11. The method of claim 10, further comprising pulsing at least one of an additional read, phase encoding, and slice selection gradient during the evolution time symmetrically before the first and after the second pulse of the pair to cause a dephasing of spins moving in a direction of the at least one additional read, phase encoding, and slice selection gradient.

12. The method of claim 1, further comprising recording a slice image of the body in a second measurement step using an unmodified RARE method to produce second imaging signals and analyzing a difference between the first and the second imaging signals.

* * * * *